(12) United States Patent
Jaffe et al.

(10) Patent No.: US 7,420,481 B2
(45) Date of Patent: *Sep. 2, 2008

(54) INTERSPERSED TRAINING AMONG DATA

(75) Inventors: Steven T. Jaffe, Irvine, CA (US); Kelly B. Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 487 days.

This patent is subject to a terminal disclaimer.

(21) Appl. No.: 11/116,851

(22) Filed: Apr. 28, 2005

(65) Prior Publication Data

US 2005/0184887 A1     Aug. 25, 2005

Related U.S. Application Data

(60) Continuation of application No. 10/828,450, filed on Apr. 20, 2004, now Pat. No. 6,897,791, which is a continuation of application No. 10/703,286, filed on Nov. 7, 2003, now Pat. No. 6,891,485, which is a division of application No. 09/729,442, filed on Dec. 4, 2000, now Pat. No. 6,693,566.

(60) Provisional application No. 60/168,808, filed on Dec. 3, 1999.

(51) Int. Cl.
*H03M 7/34* (2006.01)

(52) U.S. Cl. .......................................... 341/51; 341/50

(58) Field of Classification Search .............. 341/50–70
See application file for complete search history.

(56) References Cited

U.S. PATENT DOCUMENTS

| | | | |
|---|---|---|---|
| 4,289,815 A | 9/1981 | Lee | |
| 4,365,716 A | 12/1982 | Watt | |
| 4,416,791 A | 11/1983 | Haq | |
| 4,844,828 A | 7/1989 | Aoki | |
| 5,015,513 A | 5/1991 | Newbold et al. | |
| 5,080,226 A | 1/1992 | Hodakowski et al. | |
| 5,230,944 A | 7/1993 | Beer et al. | |
| 5,279,421 A | 1/1994 | Gouge et al. | |
| 5,330,047 A | 7/1994 | Gouge et al. | |
| 5,362,532 A | 11/1994 | Famili et al. | |

(Continued)

FOREIGN PATENT DOCUMENTS

EP      0 328 052 A1     8/1989

(Continued)

*Primary Examiner*—Lam T Mai
(74) *Attorney, Agent, or Firm*—Garlick Harrison & Markison; Shayne X. Short

(57) ABSTRACT

A communications system, having a combination Reed-Solomon encoder and a Turbo-Code encoder Data frame configuration which may be changed to accommodate embedded submarkers of known value are embedded in with the data order to aid synchronization in the receiver system, by providing strings of known symbols. The string of known symbols may be the same as the symbols within a training header that appears at the beginning of a data frame. Frame parameters may be tailored to individual users and may be controlled by information pertaining to receivers, such as bit error rate, of the receiver. Additional headers may be interspersed within the data in order to assist in receiver synchronization. Frames of data may be acquired quickly by a receiver by having a string of symbols representing the phase offset between successive header symbols in the header training sequence in order to determine the carrier offset.

20 Claims, 15 Drawing Sheets

U.S. PATENT DOCUMENTS

| | | |
|---|---|---|
| D355,436 S | 2/1995 | Suwa |
| 5,441,805 A | 8/1995 | Kwok |
| 5,487,940 A | 1/1996 | Bianchini et al. |
| 5,487,947 A | 1/1996 | Kakishita et al. |
| 6,693,566 B2 * | 2/2004 | Jaffe et al. .................... 341/50 |
| 6,828,926 B2 * | 12/2004 | Jaffe et al. .................... 341/50 |
| 6,891,485 B2 * | 5/2005 | Jaffe et al. .................... 341/50 |
| 6,897,791 B2 * | 5/2005 | Jaffe et al. .................... 341/50 |
| 6,985,093 B2 * | 1/2006 | Jaffe et al. .................... 341/50 |

FOREIGN PATENT DOCUMENTS

| | | |
|---|---|---|
| EP | 0 328 245 | 8/1989 |
| GB | 2 150 908 A | 7/1985 |
| JP | U-60-32273 | 3/1985 |
| JP | A-61-164983 | 7/1986 |
| JP | 226569 | 9/1989 |

* cited by examiner

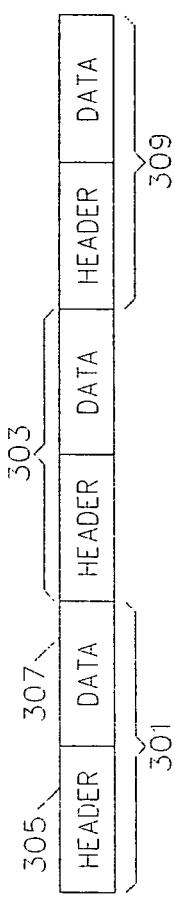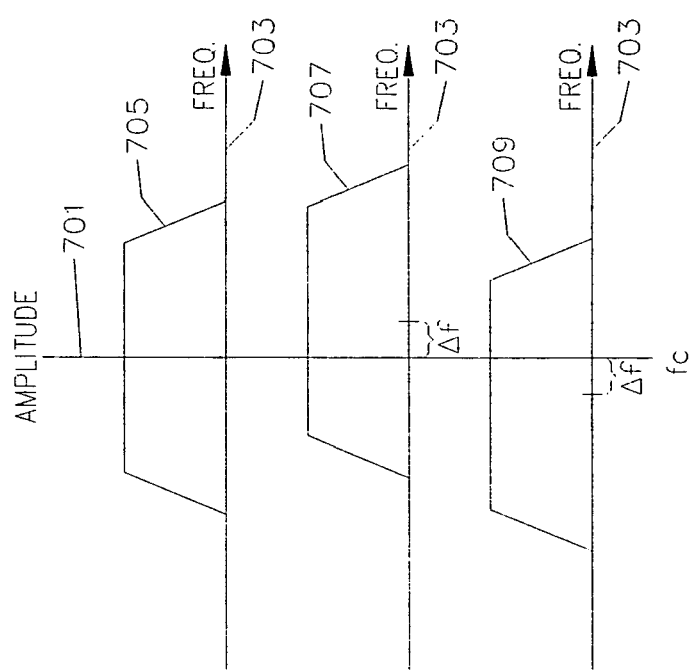

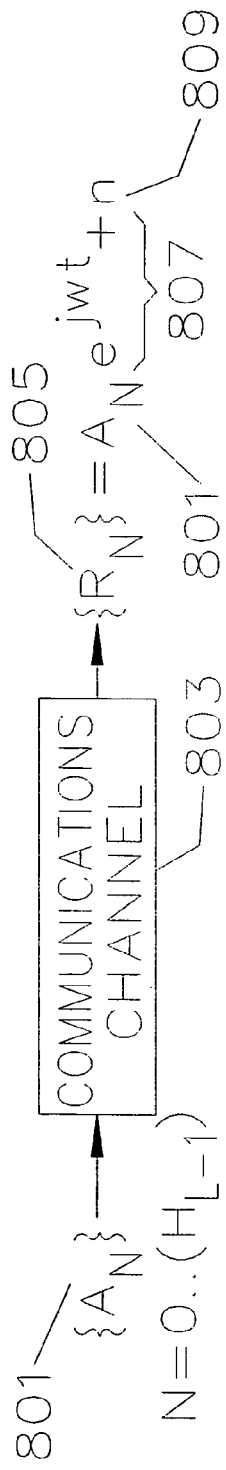
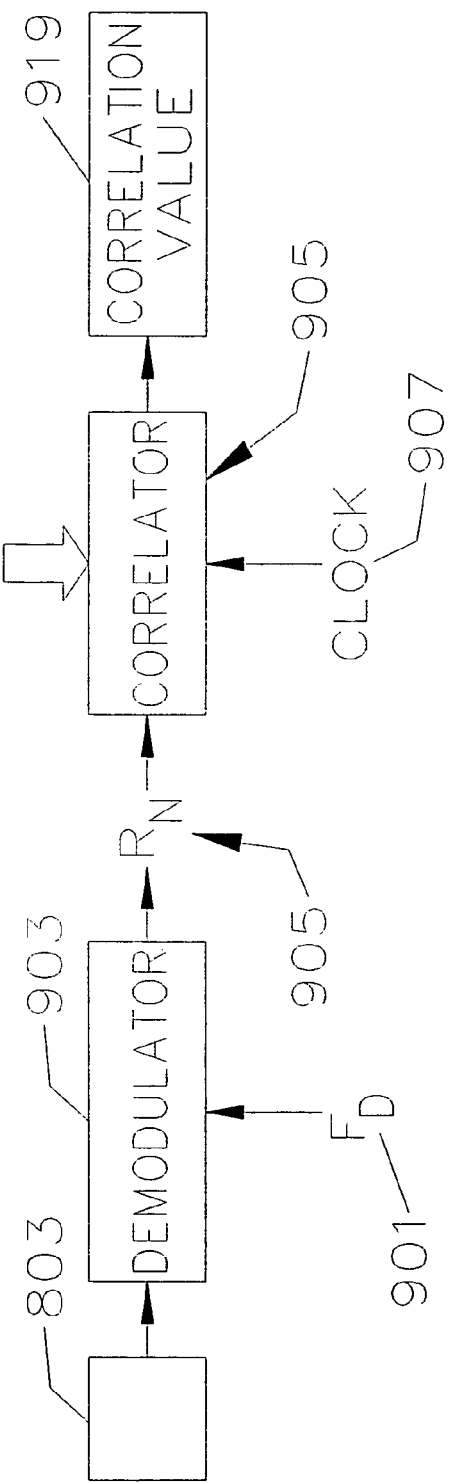

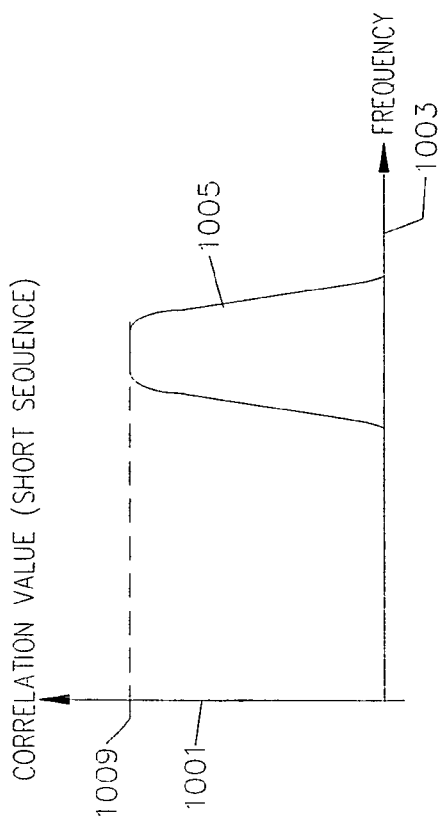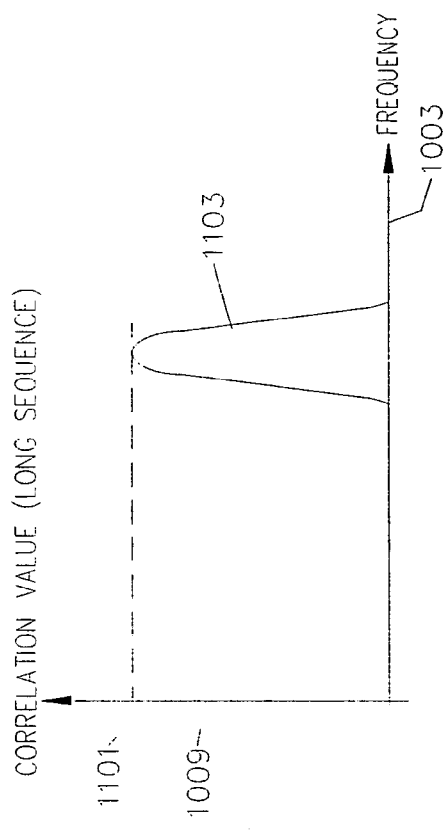

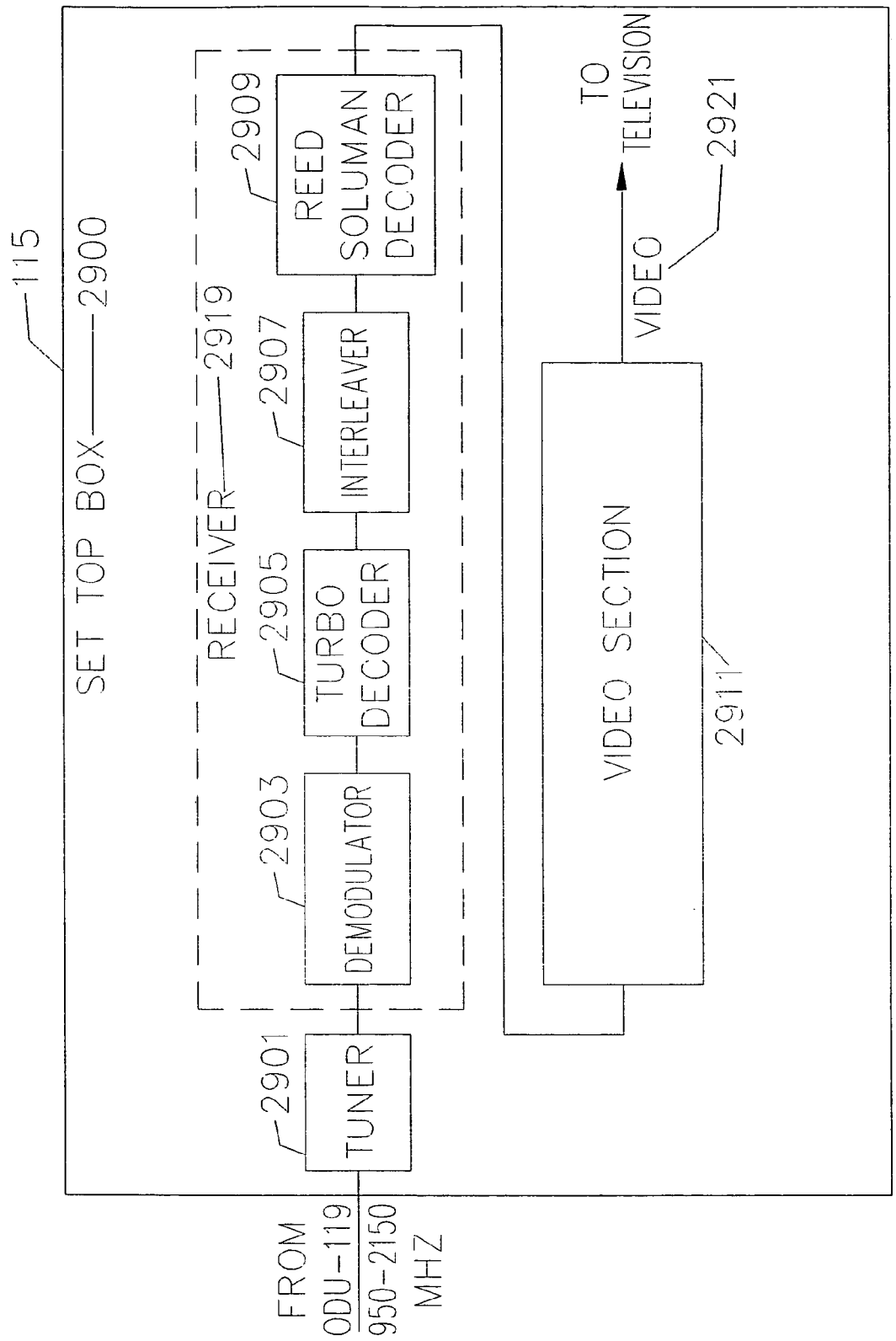

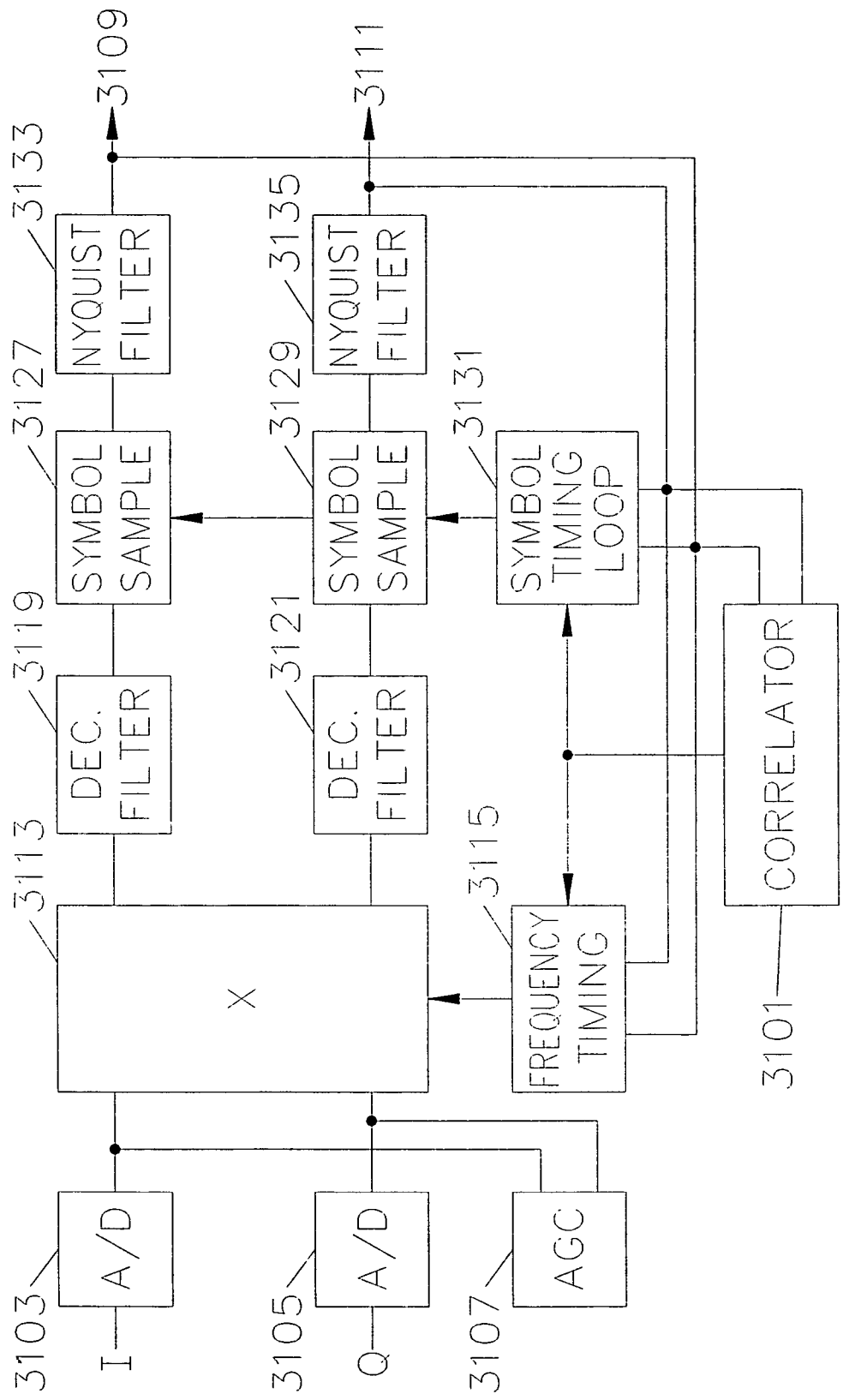

INTERSPERSED TRAINING AMONG DATA

CROSS REFERENCE TO RELATED PATENTS/PATENT APPLICATIONS

The present U.S. Continuation Patent Application claims priority pursuant to 35 U.S.C. § 120, as a continuation, to U.S. Continuation patent application Ser. No. 10/828,450, entitled "Interspersed training for turbo coded modulation," filed Apr. 20, 2004 now U.S. Pat. No. 6,897,791, which is hereby incorporated herein by reference in its entirety and made part of the present U.S. Utility Patent Application for all purposes.

The above-referenced Continuation patent application Ser. No. 10/828,450 claims priority pursuant to 35 U.S.C. § 120, as a continuation, to U.S. Divisional patent application Ser. No. 10/703,286, entitled "Interspersed training for turbo coded modulation," filed Nov. 7, 2003 now U.S. Pat. No. 6,891,485, which is hereby incorporated herein by reference in its entirety and made part of the present U.S. Utility Patent Application for all purposes.

The above-referenced U.S. Divisional patent application Ser. No. 10/703,286, entitled "Interspersed training for turbo coded modulation," filed Nov. 7, 2003 claims priority pursuant to 35 U.S.C. § 120, as a division, to U.S. Utility patent application Ser. No. 09/729,442, entitled "Interspersed training for turbo coded modulation," filed Dec. 4, 2000, now U.S. Pat. No. 6,693,566 B2, issued on Feb. 17, 2004, which claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Patent Application Ser. No. 60/168,808, entitled "INTERSPERSED TRAINING FOR TURBO CODED MODULATION," filed on Dec. 3, 1999 (Dec. 3, 1999).

BACKGROUND OF THE INVENTION

1. Technical Field of the Invention

The present disclosure relates to digital signal reception and, in particular, signal coding which assists in the synchronization of receivers with turbo decode capability.

2. Description of Related Art

In recent years, transmission of data via satellite has increased considerably. Recently, the number of personal satellite receivers has also been increasing. As large satellite receiving antennas and expensive receivers are replaced by smaller and less expensive equipment, the demand for such systems continues to rise. As the demand for satellite communication systems rises, systems which have increased performance have a distinct market advantage. Improving designs and increasing the level of system integration within satellite receivers can offer the dual benefits of decreasing system costs and increasing performance. Accordingly, there is a need for improved satellite communication systems within the art.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

These and other features, aspects, and advantages of the present invention will become better understood with regard to the following description, appended claims, and accompanying drawings where:

FIG. 2 is a graphical illustration of a data format as may be used with embodiments of the present invention.

FIG. 3 is a graphical illustration of frequency versus amplitude graphs representing a band of signals with different center frequencies (carrier offsets).

FIG. 4 is a graphical representation of header symbols being transmitted through a communications channel.

FIG. 5 is graphical illustration of a mechanism that may be used to search for given sequence of symbols, such as those found in a header.

FIG. 6 is a graph illustrating correlation values versus frequency utilizing a system for a short sequence illustrated in FIG. 5.

FIG. 7 is a graph of correlation value versus frequency when a long sequence is being correlated.

FIG. 19 is a block diagram of a set top box according to an embodiment of the current invention.

FIG. 20 is a block diagram of a receiver according to an embodiment of the invention.

DETAILED DESCRIPTION OF THE INVENTION

Exemplary Communication System

In the following description, reference is made to the accompanying drawings, which form a part hereof, and in which is shown, by way of illustration, specific embodiments illustrating ways in which the invention may be practiced. It is to be understood that other embodiments may be realized, as the inventive concepts disclosed herein may be used in the design and fabrication of other embodiments, without departing from the scope and spirit of the inventive concepts disclosed herein.

Accordingly, embodiments of the present invention relate, generally, to satellite communication systems. However, for the purposes of simplifying this disclosure, the embodiments are described herein with relation to direct broadcast satellite systems. Although the described exemplary embodiments disclosed herein are directed to direct broadcast satellite systems, there is no intent to limit the invention to the example embodiments. The exemplary embodiments are intended to illustrate inventive aspects of the present invention, which are applicable to a wide variety of electronic systems.

Satellite communication systems in general comprise three parts. The first part is a transmit system also known as a ground station. The transmit system may receive data from a variety of sources such as cable companies, Internet providers, etc. The received data is then coded, modulated and provided to a transmitter for broadcast. Coding generally includes a forward error correcting code. A forward error correction and modulation section of a transmitter accepts digital data and then constructs a signal that will be relayed, via a satellite, to the user. The second element in the satellite communication system is a satellite, which is illustratively a geo-synchronous satellite. The third part of the satellite communication system is a receiver system. The receiver system generally comprises an outdoor unit and a receiver which receives the signal from the outdoor unit, demodulates it and decodes it to recover the original signal. The original signal is then available for use in a device such as a television or computer.

Figure 1:
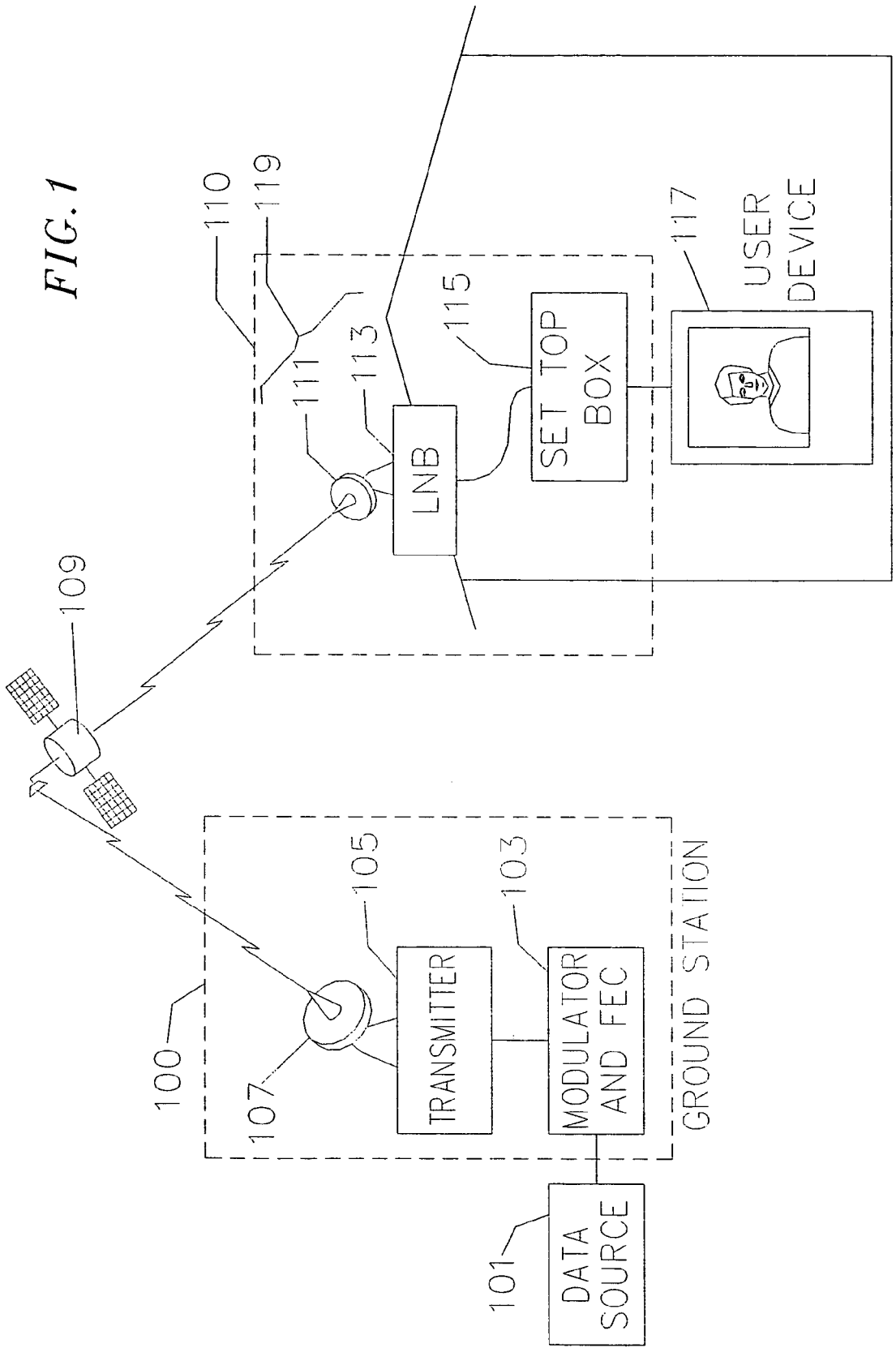
FIG. 1 is a graphical representation of an example environment in which embodiments of the present invention may operate.

FIG. 1 is a graphical representation of an example environment, in which the described exemplary satellite communication system may operate. Within the environment of FIG. 1, a data source 101 provides data to a ground station 100, which then broadcasts the data to a satellite 109. The satellite in turn re-broadcasts the data to a receiver system 110 thereby providing it to a user device 117.

In FIG. 1 the data source 101, such as a television cable signal, represents an example of one of a number of various types of data signals, which may be conveyed by the system. For example, the data signals may include, but are not limited to, television channels, music channels, or data from Internet websites. The data signals are provided, by the data source 101, to a modulator and forward error correction (FEC) 103. Within the modulator and FEC 103, the data is modulated on one or more carrier waveforms. The modulator and FEC 103 translates the data from data source 101 into a form suitable for transmission. The modulated data is further coupled to a transmitter 105. In the transmitter 105, the data stream from the modulator and FEC may be further amplified and coupled, for example, to a dish antenna 107 for transmission to the satellite 109.

The satellite 109 accepts data transmitted from dish antenna 107. Satellite 109 is commonly a geo-synchronous satellite, in which the satellite=s position is a constant location above the earth, but is not limited to such. In a geo-synchronous satellite, orbital rotation of the satellite is one day exactly matching the rotational speed of the earth, thereby maintaining the satellite at a constant position above the earth. The data transmission is accepted by the satellite 109, amplified and rebroadcast to the receiver system 110 on earth.

A user antenna 111, accepts the data transmission from the satellite 109. The received signal is then further coupled into a LNB (low noise block) 113 where it is amplified. The LNB 113 then provides the signal to a set top box 115. Within the set top box 115, the signal is demodulated and converted into a form which may be used by the user device 117, such as a television or computer. The LNB 113 and the antenna 111 are collectively referred to as the ODU (outdoor unit) 119 because they are typically located outdoors.

Transmission of Data Between the Transmit and Receiver System

FIG. 2 is a graphical illustration of a data format as may be used with embodiments of the present invention. The data stream is divided into a series of successive concatenated frames. Three successive concatenated frames are illustrated in FIG. 2 at 301, 303 and 309. A typical frame 301 may comprise a header 305 followed by data 307. Coupling a header 305 along with data 307 in a discrete frame 301 may provide particular advantages. For example, the frame 301 may have a different modulation scheme than a successive frame 303. Frame 301 may contain QPSK symbols and frame 303 may contain 8PSK symbols, and each frame may be intended for different receivers. Additionally a different format can be used for the header and the data, for example a QPSK header may be used with 8 PSK data. The header may be encoded so as to indicate the format of the data within the block, or of future blocks. Additionally the header may contain a "training sequence" to assist the receiver in synchronizing to the transmitted signal. A great variety of combinations of data partitioning are possible. Each frame may be intended for different users and hence may have different types of modulation and data formats in successive data frames. By using such a flexible scheme for data delivery, a variety of user needs can be accommodated.

Compensating for Frequency Offsets

FIG. 3 is a graphical illustration of frequency versus amplitude graphs representing a band of signals with different carrier (center) frequencies having differing carrier offsets. The band-pass curve 705 represents a nominal case in which $F_c$ (the desired center frequency) is situated in the center of the bandwidth of the signal 705. In actual practice, the frequency band may be offset from the desired center as illustrated in bandwidth curves 707 and 709. This offset may be due to a variety of factors, such as drift in the transmitter or receiver front end, drift in the relay satellite, and in non Geo-stationary systems due to Doppler effects. In curve 707, the center frequency has been displaced and is actually no longer equal to $F_c$ but is equal to $F_c+\Delta F$. In curve 709, the carrier frequency is actually lower than $F_c$, the actual center frequency for band-pass curve 709 is located at $F_c-\Delta F$. In practice, offsets can cause considerable displacement of a signal=s center frequency. Offsets in carrier frequency typically must be accounted for to assure proper reception. Therefore, finding the actual carrier frequency is commonly an early step in locking a receiver system to a transmitted signal.

In an exemplary embodiment of the present invention, header data is identified and, in the process of identifying the header data, the frequency offset of the communications channel carrier frequency is found. One method for determining the carrier frequency offset at the receiver system is to mix the incoming signal with series of frequencies one at a time until the correct frequency is found. By mixing the incoming signal across a series of frequencies and correlating the resultant signal (for example a resulting baseband signal), the actual center frequency of the incoming signal can be determined. Mixing the incoming signal with a series of frequencies, however, can take considerable amount of time. The number of frequency offsets that may have to be applied to the incoming signal, before the correct frequency offset is found, can be considerable. It is desirable to be able to determine the offset of the center frequency without going through a process of trial and error, incrementing the mixing frequency and using the incremented frequency to mix with the incoming signal.

FIG. 4 is a graphical representation of header symbols being transmitted through a communications channel. A sequence of symbols 801 is represented by $A_N$. The sequence $A_N$ contains a number of symbols $H_L$ which is equal to the header length. $A_N$ represents a sequence of header symbols for N=0 to N=($H_L$−1).

The header symbols $A_n$ are coupled into communications channel 803. The symbols are then accepted from the communication channel by a receiver system. The received symbols $R_N$ form a set of symbols 805 that have had noise and/or distortion added to them as a consequence of transmission through the communications channel. The sequence of symbols $R_N$ can be represented by a modeling mathematical expression $A_N e^{-jwt} + N$. Term N (809) represents the noise added by the communications channel and term $e^{-jwt}$ (807) is a frequency component, representing the frequency offset of $R_N$=S carrier. The communications channel 803 generally comprises everything between the transmitter and the user=s receiver system.

For a given frequency offset represented by term 807, $H_L$ (the length of the sequence $A_N$) determines how large of a frequency offset can be tolerated and still form a proper correlation. The longer the sequence of symbols that are being detected in a correlator, the less frequency offset that can be tolerated in the center frequency. Therefore, in order to tolerate a large frequency offset, a short sequence is desirable. On the other hand, a long sequence will result in more gain when correlated with the sequence to be detected. So from the standpoint of correlator gain, a long sequence is desirable. Generally, correlator gain is more important than being able to tolerate a large frequency offset, because the correlator gain may be used to offset the noise within the channel.

FIG. 5 is a graphical illustration of a mechanism in the receiver system that may be used to search for a given sequence of symbols, such as "training symbol" found in a header. Training symbols found in the header are known symbols, which a receiver system may look for in order to synchronize or "lock to" a received transmission. The output of the communications channel 803 is provided to a demodulator 903 in the receiver system. The demodulation frequency $F_D$ 901 is also coupled into the demodulator 903. It is $F_D$ 901 that will be mixed with the incoming signal and that must be properly adjusted to translate the incoming data symbol stream, from the communications channel 803, into a baseband sequence of received symbols $R_N$, 805. The baseband symbol stream $R_N$, (805), is coupled into a correlator 905. The correlator 905 will search for a match between the header sequence $A_N$ and the received symbols $R_N$. The correlator is clocked by a clock 905 which controls the comparison between the known header $A_N$ and the received symbol stream $R_N$. The comparison of $A_N$ and $R_N$ within the correlator 905 is can be a bit by bit comparison. The bits that match each other are typically added to produce a correlation value 919. The correlation process can be used to ascertain the center frequency of the carrier of the received symbol $R_N$ data stream. For example, $F_D$ 911 may be changed in steps (swept) and the correlation value, which results, saved. Once the demodulation frequency has been swept across the range of possible values, the correct demodulation frequency can be ascertained by observing which frequency step gives the highest correlation value.

FIG. 6 is a graph illustrating the correlation value for a short correlation sequence versus frequency for the correlation system illustrated in FIG. 5. The maximum correlation value is given by point 1009. The correlator output 1005 tends to have a wider curve as the sequence correlated becomes shorter. However, the maximum output 1009 tends to become smaller as the sequence becomes shorter, thus yielding a lower gain.

FIG. 7 is a graph of correlation versus frequency offset for a long sequence being correlated by a system such as illustrated in FIG. 5. When a long sequence is correlated, the curve produced 1103 is much narrower and its peak value is higher than a short sequence. This means that the correlator has more gain, but that finding $F_D$ 901 is generally of greater concern. In other words, a shorter sequence will allow larger steps in $F_D$ 901 to be used in finding the correct $F_D$, than will a longer sequence. Therefore, to search for a longer sequence, the frequency steps that are used as the demodulator frequency 901 should be closer in value and, hence, may comprise more steps than a corresponding shorter sequence. Even if a shorter correlation sequence can be tolerated, the process of trial and error in order to determine the correct frequency of demodulation 901 can be cumbersome and time-consuming. It is advantageous to eliminate the trial and error method of determining the necessary demodulation frequency.

Figure 8:
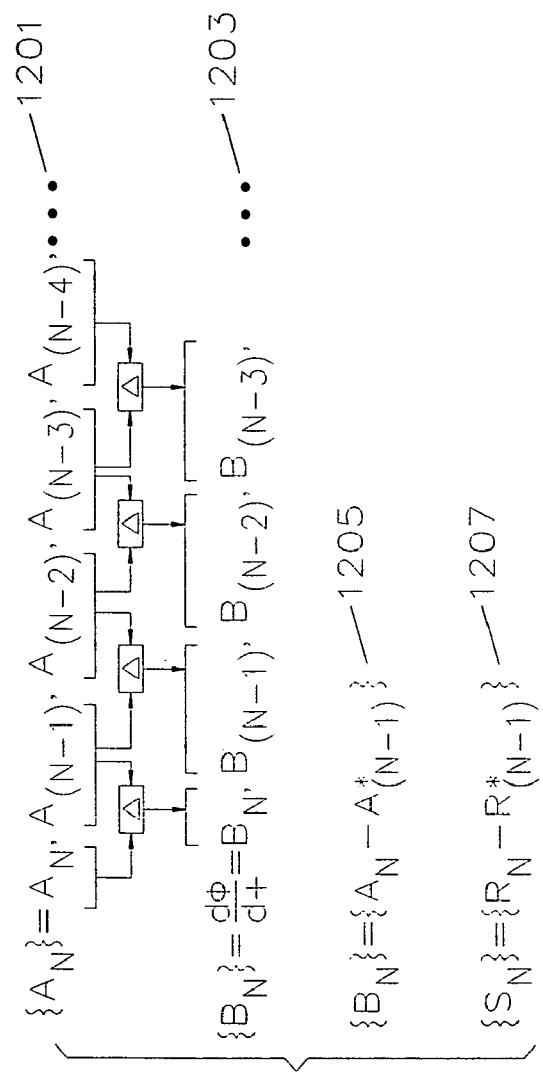
FIG. 8 is a graphical illustration of a step in the process, which can find the proper demodulation frequency of a signal, without the necessity of a series of cut and try steps.

FIG. 8 is a graphical illustration of a step in the process, which can find the proper demodulation frequency of a signal without the necessity of a series of trial and error steps. Equation 1201 represents a series of N header symbols. The series of header symbols are part of a data frame, for example 301, as illustrated in FIG. 2. The satellite transmission may contain a header 305 and data 307 in a frame 301 as a convenient way of packaging satellite transmissions. The header may be known to a receiver system beforehand and hence is a convenient data synchronization pattern. A known header, called a training sequence, is used to adjust the receiver system to receive the data frame.

From the header symbols, as given in equation 1201, a secondary sequence 1203 can be created. The secondary sequence, represented by $B_N$ is a sequence of symbols which represents the phase difference between successive symbols within the header. So, for example, the symbols in the sequence $B_N$ are found by taking the phase difference between $A_N$ and $A_{N-1}$. Symbol $B_{N-1}$ is formed by taking the difference between symbol $A_{N-1}$ and $A_{N-2}$. The remaining symbols in the $B_N$ sequence are formed similarly, as illustrated in equation 1203. The general formula for the $B_N$ sequence is given in equation 1205. Because the header $A_N$ is known beforehand by the receiver system, the sequence $B_N$ also may be known beforehand (or computed) by the receiver system.

A sequence $S_N$ is formed by taking the phase difference between successive received symbols $R_N$. This sequence is as illustrated in equation 1207.

Figure 9:
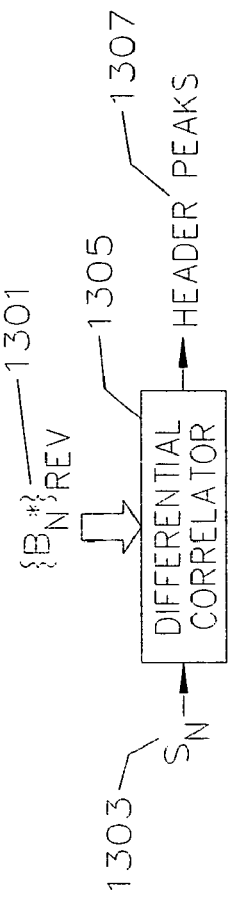
FIG. 9 is a graphical representation of a differential correlator.

FIG. 9 is a graphical representation of a differential correlator in the receiver system that can be used to correlate the $S_N$ and $B_N$ sequences of symbols. The differential correlator 1305 correlates the phase differential between successive symbols. $B_N$ is the sequence to which the received symbol differential sequence $S_N$, 1303, is compared. [The sequence $B_N$ may be time reversed and a conjugated version of $B_N$ ($B_N$*)]. When the received symbol differential string $S_N$ is compared to the known differential sequence $B_N$, a series of header peaks 1307 are produced at the output of the differential correlator 1305.

Figure 10:
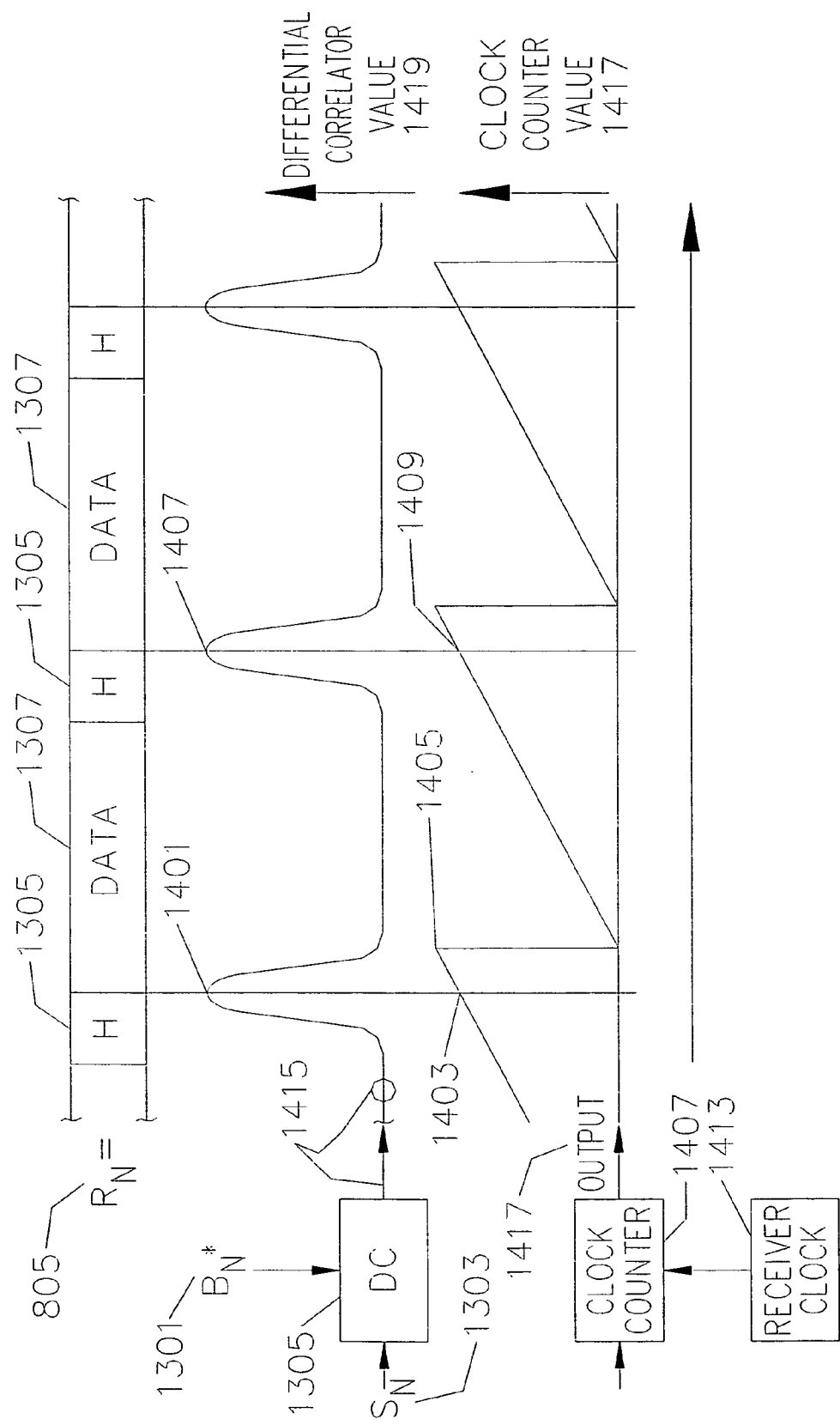
FIG. 10 is a graphical illustration relating header data to differential correlator output and further relating header position to a counter, which counts cycles of a receiver clock.

FIG. 10 is a graphical illustration relating the header data to the differential correlator output and further relating header timing to a counter, which counts cycles of a receiver system clock. The differential correlator 1305 receives the differential symbol stream $S_N$. The differential correlator 1305 also has preloaded the $B^*_N$ sequence, 1301. The correlation between output 1415 of the differential correlator 1305 compared to the received symbol sequence $R_N$ is shown in graph 1419. Once a complete header has been received and the differential sequence $S_N$ created from the header, a differential correlator peak 1401 will be seen from the correlation between $S_N$ and $B_N$.

Concurrently with the operation of the differential correlator 1305, a clock counter 1407 counts cycles of the receiver system clock 1413. The clock counter 1407 is configured so that it rolls over, that is, once the clock counter 1407 achieves a maximum value, the counter is automatically reset to zero upon the receipt of the next clock pulse. The clock counter 1407 is configured so that its maximum count will correspond to a period that is longer than the combined period of the header and data. When the clock counter 1407 is free-running, i.e., counting receiver system clock cycles and resetting upon a maximum clock counter count, its output period is guaranteed to be longer than the received header plus data packet. Because the roll over period of the clock counter is longer than the longest combined period of a header plus data, it is guaranteed that, between rollovers of the clock counter, a maximum differential correlator value, for example 1401, will occur. Because a maximum value is being determined, the system is not dependent on a particular threshold value. Because there is always a maximum value within the clock counter period, any design difficulties encountered by attempting to adjust a correlator output threshold for changing signal conditions is eliminated. The output counter value 1417 is portrayed as a saw-toothed waveform. This portrayal is for purposes of illustration and comparison only. The output 1417 of clock counter 1407 is generally a sequence of increasing integers, and therefore, the output counter value 1417, instead of being a sawtooth as portrayed, is generally a series of discrete steps.

Once the maximum differential correlator value has been ascertained for the free-running clock counting period, the clock counter output value corresponding to the differential correlator peak value within the clock counter period can be determined. The output counter values 1403 and 1409 correspond to maximum differential correlator values. By knowing the values of the clock counter that correspond to successive differential correlator peaks, i.e. 1401 and 1409, the actual period of the header plus data can be determined.

Figure 11:
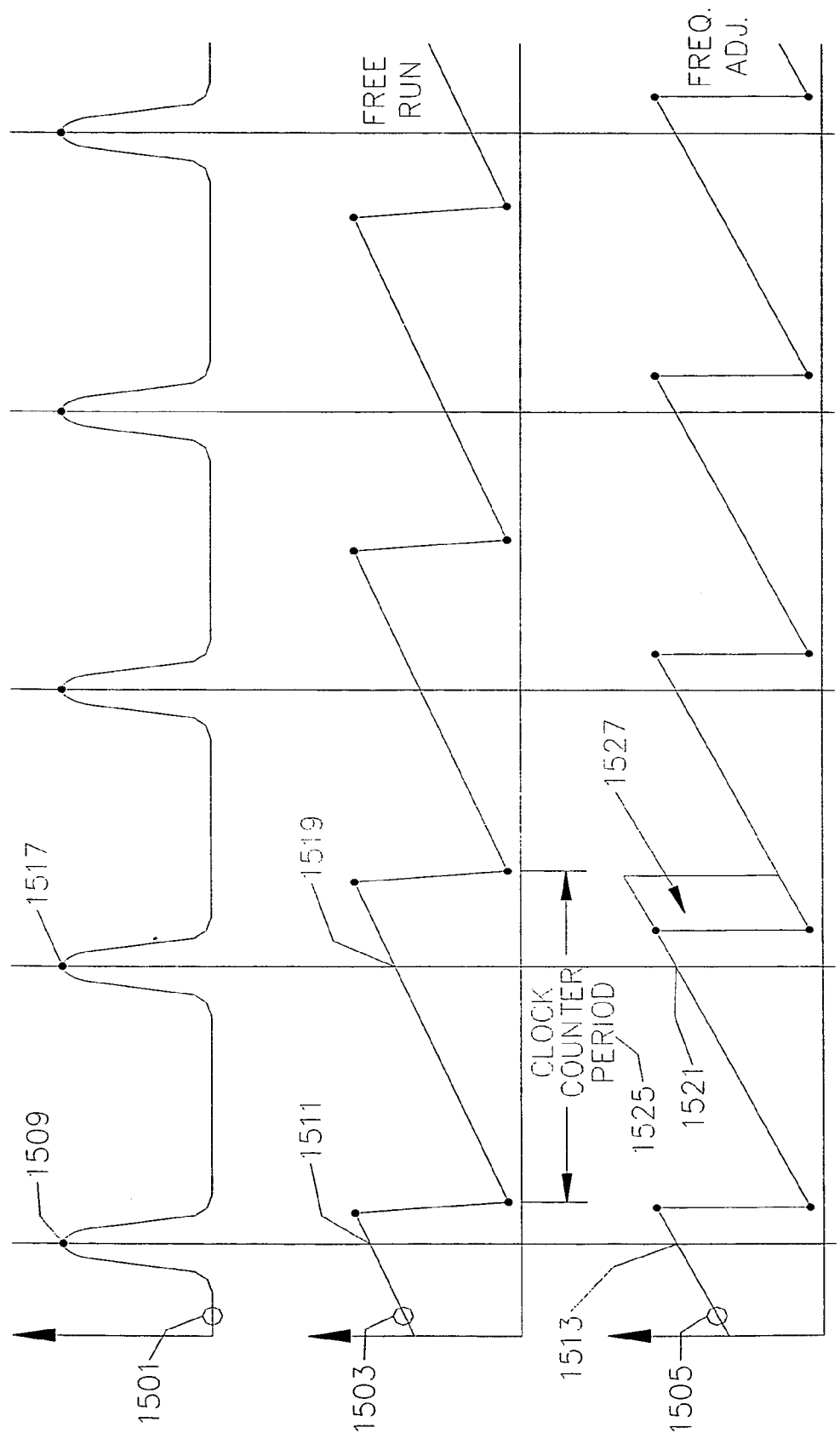
FIG. 11 is a graphical illustration of the process by which the frequency of the receiver clock may be synchronized to an incoming data stream, using a clock counter.

FIG. 11 is a further graphical illustration of the process by which the receiver system clock may be synchronized to the incoming data stream using the clock counter 1413. Curve 1501 represents the output of the differential correlator 1305. Initially, the receiver system clock counter 1413 is in a condition of free-run, as illustrated in curve 1503. When the clock counter 1413 is free-running, it will count the receiver system clock pulses up to a maximum number and then roll over. The time between roll over of the clock counter is referred to as the clock counter period, for example 1525. By observing the output of the differential correlator 1305 during a full clock counter period, for example 1525, a time between peak correlator output values can be determined.

Once the peak correlator values 1509 and 1517 have been determined, corresponding values 1511 and 1519 of the clock counter 1413 can be determined. Once the values 1511 and 1519 have been determined, the difference between them can be determined. The free-run frequency of the receiver system clock, and hence the free-run frequency of the clock counter 1413, which counts the cycles of the receiver system clock, can be adjusted so that the difference between 1511 and 1519 is zero. When the receiver system clock 1413 has been adjusted to a point where values 1511 and 1519 are equal, the receiver system clock has been synchronized in frequency with the transmitter clock. The frequency adjustment is accomplished by decreasing the clock counter period, as illustrated by 1527 of the waveform 1505.

Those skilled in the art will recognize that the preceding description is exemplary only and many variations of this scheme are possible. For example, instead of merely measuring the time difference between points 1511 and 1519, a series of points may be measured and an average time difference may be computed. Similarly, two maximum correlator values can be selected from a number of correlator peaks in order to select, for example, the maximum value of correlation peaks over a series of multiple correlation peaks. Once the frequency has been adjusted correctly; (as illustrated in wave form 1505) the timing difference between 1511 and 1521, which represents the clock counter value, at which correlation peaks 1509 and 1517 occur, should be zero.

Once the frequency of the receiver system clock counter 1413 has been adjusted to match the transmit clock, the receiver system clock can then be adjusted to match the phase of the transmit system. Because the differential correlator 1305 correlates the phase difference between adjacent symbols, it is essentially phase blind. That is, once a sequence has been created, such as $S_N$ or $B_N$, which comprises a phase differential between symbols, the actual phase information relative to each symbol is lost. To establish phase lock with respect to incoming symbols, the received sequence is correlated in real time.

Figure 12:
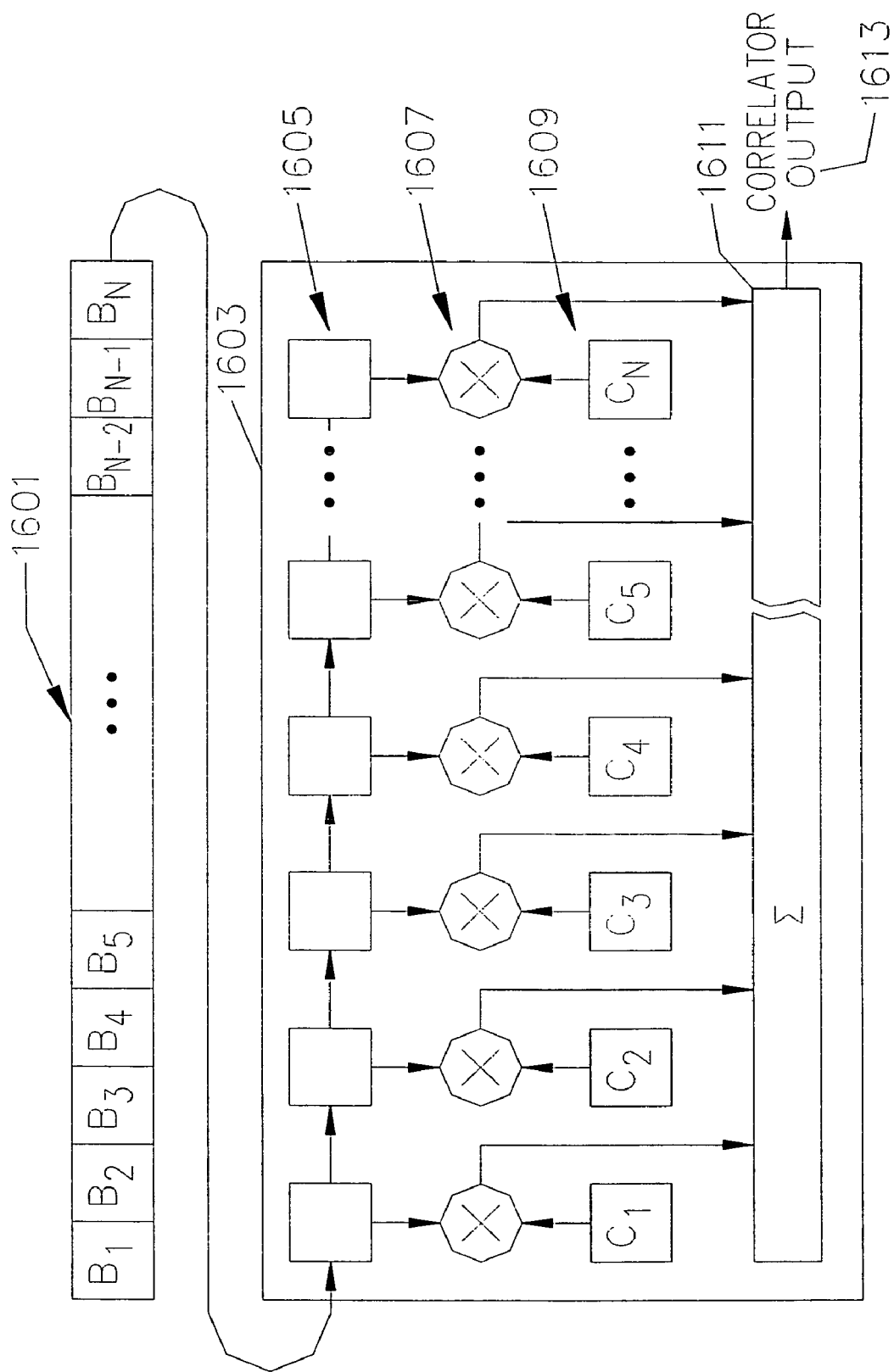
FIG. 12 is a block diagram illustrating the parts of a common correlator as may be used to establish phase lock to a received signal.

FIG. 12 is a block diagram illustrating the parts of an exemplary correlator, as may be used to establish phase lock. An input sequence 1601 is coupled into a correlator 1603. The input sequence 1601 is then coupled into a tapped delay line 1605. The stages of the tapped delay line are compared in a series of comparators 1607, to a known sequence 1609. The output of all the comparisons are then summed in a summation unit 1611, which produces the correlator output 1613. One drawback of a correlator, such as illustrated at 1603, is that it is very area intensive to fabricate such a correlator on an integrated circuit. That is, if the input sequence 1601 happens to be 128 symbols long, then 128 multipliers, for the multiplier chain 1607, and 128 addition stages within the summation unit 1611 will need to be employed. It is desirable to find a method that is less area intensive when implemented on a integrated circuit chip.

Figure 13:
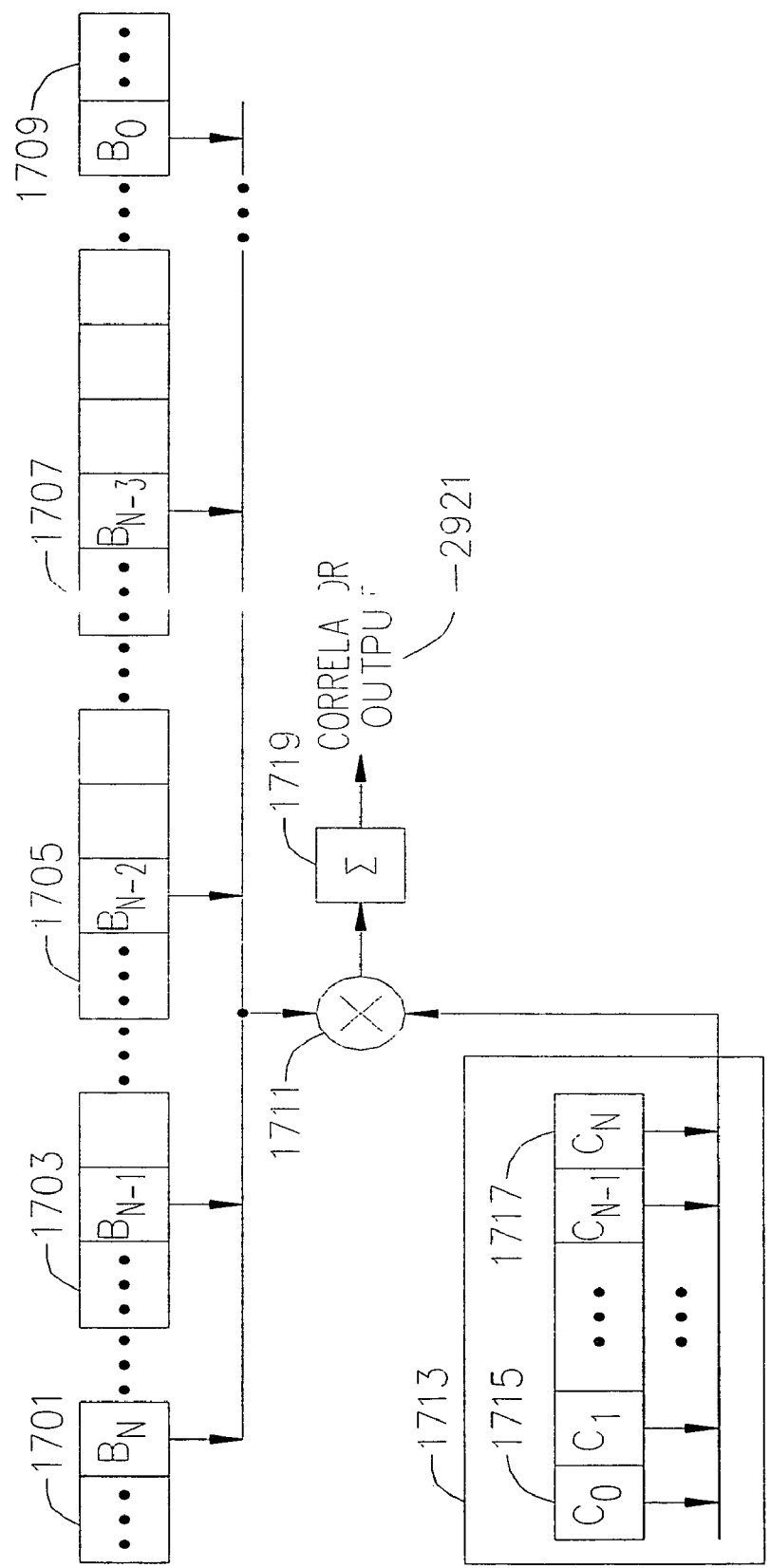
FIG. 13 is a graphical illustration of a serial correlator as may be used in embodiments of the present invention.

FIG. 13 is a graphical illustration of a serial correlator as may be used in certain embodiments of the present invention. A series of comparison patterns, such as packet headers $B_N$, are illustrated. The sequential packet headers are numbered 1701, 1703, 1705, 1707, and 1709. The pattern that will be compared to the header pattern is contained in a memory 1713. Instead of comparing all of the bits at the same time, as with the exemplary correlator illustrated in FIG. 12, the serial correlator compares one bit at a time. For example, $B_O$ from the first header 1709 is compared with a first bit $C_O$, 1715, in the pattern to be matched. The single bits are compared in a single bit multiplier 1711. The result of the comparison, of the individual bits in the multiplier 1711, is provided to a summation unit 1719. So, for example, if a pattern represented by $C_0$ 1715 through $C_N$ 1717 is being sought, the Nth bit of the header $B_N$ represented by 1701 may be compared to the $C_N$ bit 1717 of the pattern to be correlated. When the next header arrives, the $C_{N-1}$ bit from the comparison stream 1713 can be compared to the $B_N-1$ bit in the second header to arrive 1703. In this manner, not all the bits are compared at once. Instead of requiring, for example, 128 multipliers and an adder chain capable of adding 128 results, the serial correlator correlates one bit at a time and then sums the result. Once 128 header bits have been compared with the correlation value 1713 the correlator output 1721 becomes valid. Although the serial correlator can compare only one header bit at a time, the actual delay in achieving phase lock may not be perceptible to a user. By serializing the computation, a great savings in chip area may be realized.

The Transmit System

Figure 14:
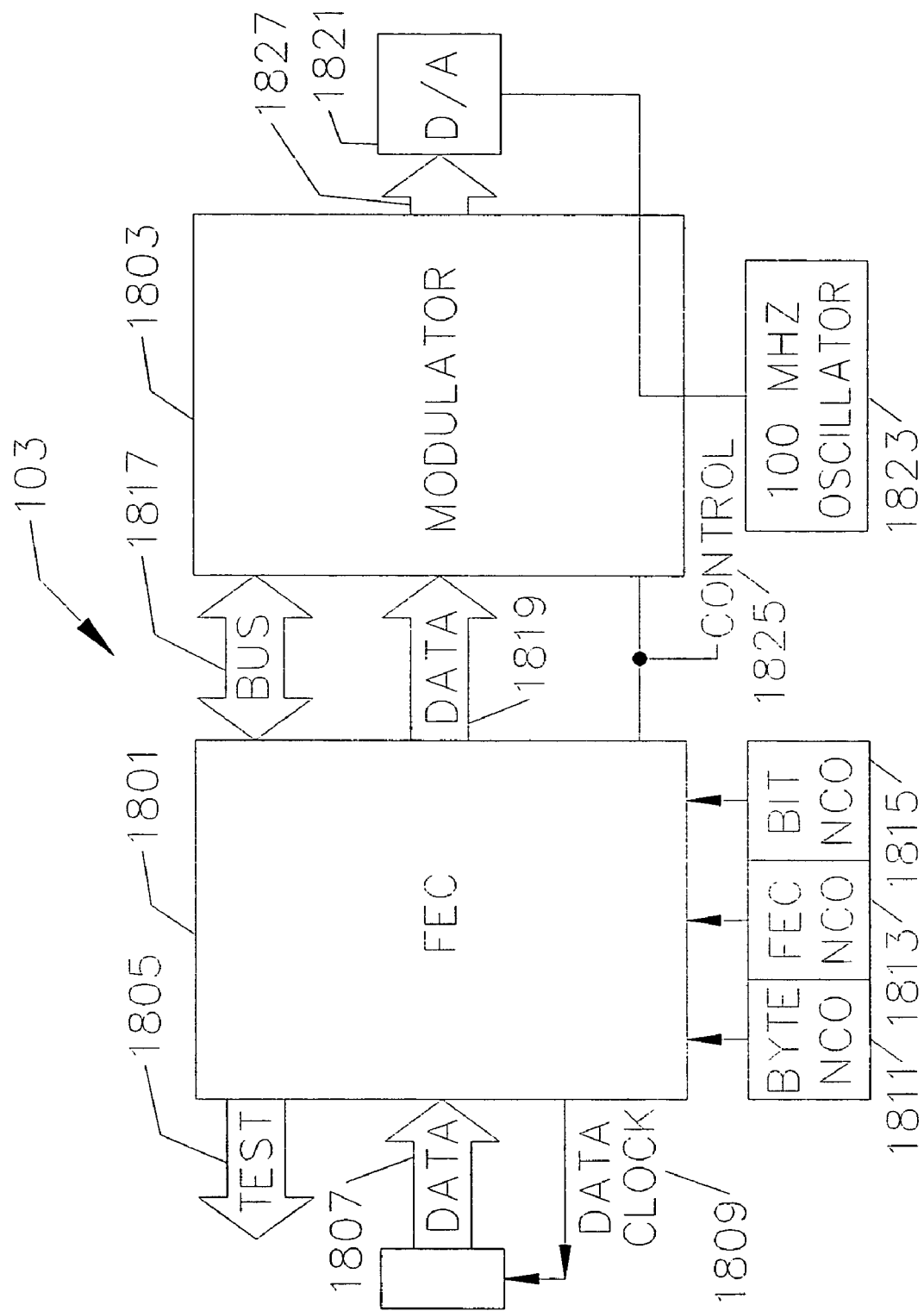
FIG. 14 is a block diagram representation of subsystem circuitry, which comprises the modulator and forward error correcting sections of a transmitter system according to an embodiment of the invention.

FIG. 14 is a block diagram representation of a modulator and FEC of a transmit system according to an embodiment of the invention. The FEC accepts data 1807 from an outside source. The data may be of any suitable type, for example, MPEG 2 (Motion Picture Experts Group) Video, DVB (Digital Video Broadcast), or PN (Pseudo-Noise) codes. In the exemplary embodiment, the FEC also provides a test data signal 1805, which can be used as a data source input 1807 to the FEC. The data signal 1805 can be used for testing, for example, in a stand-alone mode. Because the test signal is a known data pattern, the receiver system can use the same pattern to measure bit error rate. Various parameters of the circuitry may influence the bit error rate. The built in test signal 1805 may reduce the necessity of having a dedicated piece of test equipment in order to provide a known test signal to measure the bit error rate.

The FEC 1801 also includes a data clock 1809. The data clock 1809 clocks the input data 1807 and thereby controls the rate that the data is provided to the FEC 1801. The FEC also accepts clocking signals from several numerically controlled oscillator clocks. The exemplary embodiment accepts clocking inputs from a byte clock 1811 (which may also function as a data clock 1809), a forward error correcting clock 1813, and a bit clock 1815. The FEC also accepts a control input 1825. The control input 1825 may be used to control various parameters of the FEC, for example, but not limited to, modulation format, frame length of the data exiting the module, and coding rates. Once the FEC 1801 has processed the data 1807, the processed data 1819 is further provided to the modulator 1803. The modulator also communicates with the FEC via a communications bus 1817. The communications bus 1817 generally provides handshaking and protocol to control the data transfer over the bus 1817. The modulator 1803 also accepts an input from the control line 1825. The control line 1825 may be used to control various parameters within the modulator, such as filters, equalizers, and symbol mappers. The modulator 1803 also accepts a clocking signal, such as a 100 megahertz oscillator 1823. The oscillator 1823 also is coupled through the modulator and operates a digital to analog converter 1827 which accepts the data 1827 output by the modulator 1803.

Overall, the data 1807 enters the FEC 1801. The FEC codes the data and passes the coded data 1819 to the modulator 1803. The modulator 1803 accepts the data from the FEC 1801, modulates it, and places the modulated data on an output 1827. The data output 1827 is then coupled into a digital to analog converter. The digital to analog converter converts the digital signal 1827 into an analog signal suitable to be accepted by the transmitter 105 and broadcast by the antenna 107 to the satellite 109 (see FIG. 1).

Forward Error Correction

Figure 15:
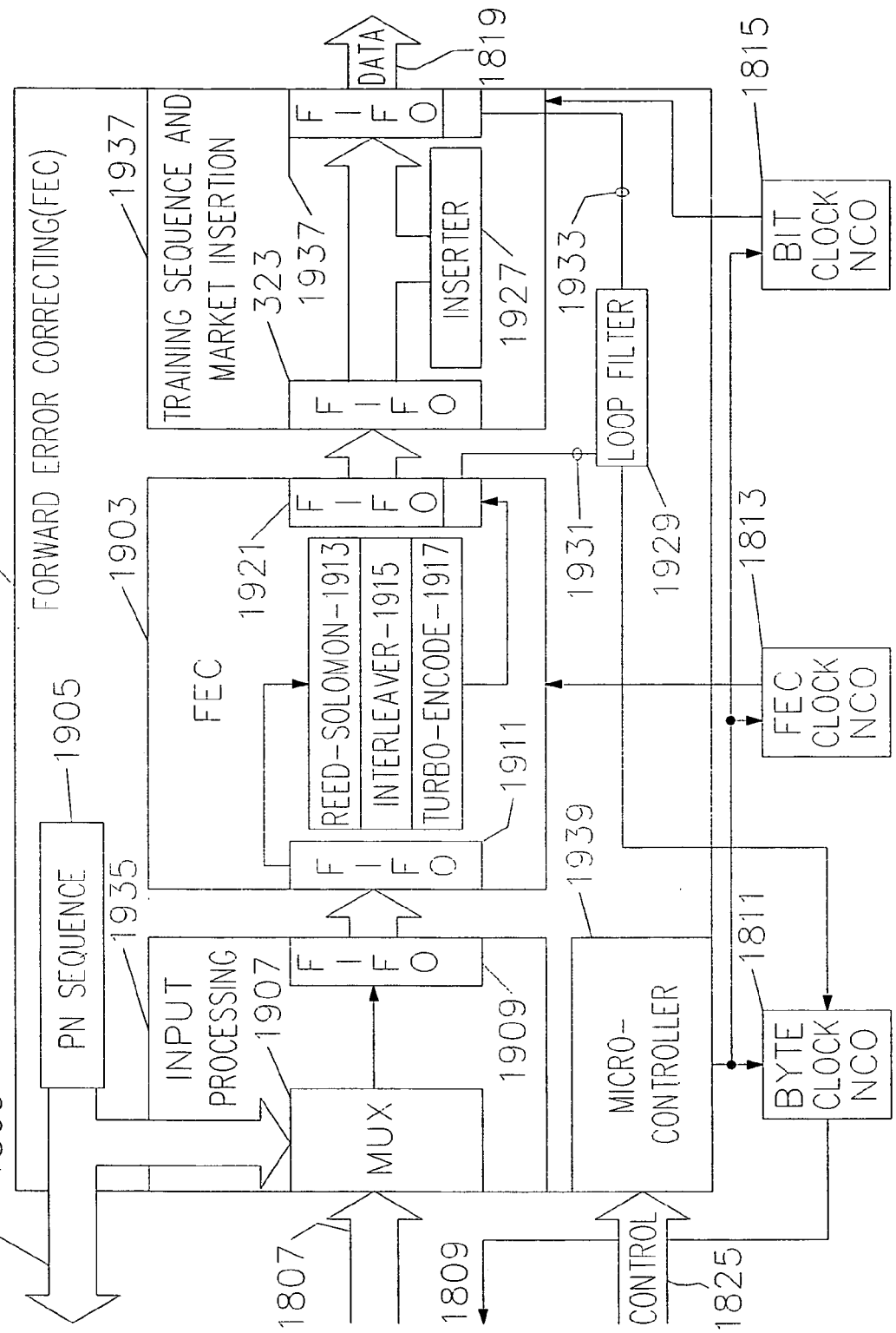
FIG. 15 is a block diagram illustrating the component and signal flow which comprise an exemplary embodiment of forward error correction according to an embodiment of the invention.

FIG. 15 is a block diagram illustrating the components and signal flow which comprise an exemplary embodiment of the FEC 1801. The FEC is divided into three asynchronous modules. The first asynchronous module is the input processing module, which receives the data input 1807. The input processing module queues the received data, then provides it to forward error correcting module 1903. It is from the functions provided in the forward error correcting module 1903 that the FEC 1801 takes its name.

The forward error correcting module 1903 processes the data provided by the input processing module 1935 and then further provides it to a training sequence and marker insertion module 1937. The training sequence and marker insertion module 1937 adds a training sequence header and may add submarkers to the data. The data is then provided to an output 1819, for acceptance by the modulator 1803.

The input processing module 1935, the forward error corrector 1903, and the training sequence and marker insertion (TSMI) module 1935 are connected serially to each other via asynchronous interfaces such as FIFO (First In First Out) queues. In other words, the coupling between the input processing module 1935 and the forward error corrector 1903 is asynchronous, as is the connection between forward error corrector 1903 and training sequence and marker insertion module (TSMI) 1937. In other embodiments, the TSMI module may be eliminated entirely.

Data 1807 is generally coupled into the FEC 1801 via the input processing module 1935. Data 1807 is provided to a multiplexer 1907 which allows a microcontroller 1939 to choose between the data input 1807 and a PN sequence generator 1905. The PN sequence generator 1905 may be used as a data source for the FEC 1801, for example, for testing. It may also be used to provide a known signal, for example, for testing the receiver system performance. The PN sequence module 1905 is also coupled to an output 1805 for use outside of the module. The data chosen by the multiplexer 1907 is queued within a first-in first-out (FIFO) queue 1909 within the input processing module 1935. Data is then further coupled from the FIFO 1909 to an input FIFO 1911 in the forward error correcting module 1903. The forward error correcting module 1903 further receives data from its input FIFO 1911 and provides it to a Reed-Solomon encoder 1913. The Reed-Solomon encoder, once it has encoded the data, then provides the Reed-Solomon encoded data to a turbo encoder 1917 and interleaver 1915 combination.

Once the Reed-Solomon encoder 1913, the interleaver 1915, and the turbo encoder 1917 completes the processing of a data symbol, it is then coupled into an output queue 1921. The output queue 1921 is provided with a fullness indicator. So, for example, if the FIFO 1921 is greater than half full, it provides an indicator signal 1931 to loop filter 1929.

The FIFO 1921 further provides symbol data to the training sequence and marker insertion TSMI module 1937. An inserter 1927 may then insert a training sequence header and/or submarkers into the data stream, for example, to accommodate the needs of a particular data receiver. It is the training sequence and marker insertion module which creates the frame structure for the data. Once the training sequence and submarkers have been inserted into the data stream, the data is coupled into an output queue 1937. The data resides in the output queue 1937 until called for by the modulator 1803. The output FIFO 1937 also has a status indicator 1933 that indicates, for example, that it is half full. The indicator is coupled into loop filter 1929. The FIFO level indicators 1931 and 1933 may both be coupled into loop filter 1929 to determine the rate at which a byte clock NCO 1811 runs.

In the described exemplary embodiment, three different clocks are used for control of the FEC 1801. The first clock is the byte clock NCO (Numerically Controlled Oscillator) 1811. The byte clock is used to control the flow of data into the FEC 1801. The byte clock can be adjusted by the microcontroller 1939 and can also be adjusted by the output from the loop filter 1929, for example, based on how full FIFOs 1921 and 1937 are. The forward error correcting module 1903 is clocked by an FEC clock 1813. Although the FEC clock 1813 is independent of the other two clocks, it too may also be controlled by the microcontroller 1939. The third clock 1815 is a bit clock. The bit clock is provided to the TSMI module 1937 and also provided to the digital to analog converter 2027 (as illustrated in FIG. 20). The bit clock 1815 also may be controlled by the microcontroller 1939. The control of the clocks by the microcontroller 1939 facilitates the ability to switch modulation on a symbol by symbol basis.

FEC Multimodulation Architecture

Because of the asynchronous nature of the modules within the FEC 1801, the flexible control of the data stream, to be modulated, can be enhanced. For example, in the described embodiment, 8PSK or QPSK modulation can both be accommodated. Other modulation types can also be accommodated. The modulation can be controlled from outside the FEC, for example, utilizing the control bus 1825. Additionally, the frame length and header training sequence composition and placement of submarkers can be varied on command. In addition, the turbo encoder 1917 can have a variety of coding rates, such as ⅔, ⅚, and ⅞. All the aforementioned parameters can be controlled from outside the FEC 1801. In addition, the number of submarkers placed within a frame can be varied in length and number. Submarkers may be used by the receiving system to track the incoming signal or re-establish lock. The variables can be changed on a frame-to-frame basis. For example, one frame can be modulated with 8PSK and a successive frame can be modulated with QPSK. Additionally, the turbo coding rates can be switched within successive frames. The number, size and spacing of submarkers also can be changed in successive frames.

As the above mentioned variables are changed within the FECs, various latencies can be encountered. The FIFOs 1909, 1911, 1921, 1923 and 1925 enable the buffering of the symbol stream as parameters are changed, for example, on a frame-to-frame or intraframe basis. The FIFOs enable the symbol stream to be queued when parameters are changed. For example, FIFO 1911, which provides data to the turbo encoder 1917, can queue input data as the turbo encoder is switched between rates of ⅔, ⅚ and ⅞. In such a way, the input stream does not have to be started and stopped as might be the case in a synchronous type design. The incoming data rate, however, should be controlled or it is likely that the FIFOs will either overflow or be starved for data at some point. In order to prevent the modules from being starved for data or overflowing, the overall rate is controlled by the byte clock 1811. The byte clock is controlled by the loop filter which receives, as its input, FIFO status signals 1931 and 1933. The loop filter receives signals 1931 and 1933, filters them and uses the filtered signal to control the frequency of the byte clock 1811. It is, of course, possible to use other FIFO status signals from other FIFOs to control the data rate input to the modules. Which FIFOs are selected as control FIFOs depend on a variety of design variables, for example, individual FIFO size, and peak data rates.

The feedback from FIFOs 1921 and 1925 are used to control the byte clock 1811 and hence the data input rate of the data 1807. Additionally control bus 1825 can communicate which variables within the FEC 1801 should change. The microcontroller 1939 may not only control the parameters within the different modules of the FEC 1801, in addition it also can load the clocks, i.e., the byte clock 1811, the FEC clock 1813, and the bit clock 1815 with starting values. Tables relating the clock frequencies to different FEC parameters can be provided in ROM (not shown) to the microcontroller 1939. When the microcontroller changes parameters within the FEC, it can also change the clock frequencies of the module clocks. These tables can be computed beforehand and placed in the ROM available to the microcontroller 1939 to control the parameters used to modulate the data 1807 as it arrives.

In a second operating mode, instead of having all the clock frequencies specified in tabular form, the microcontroller 1939 may be provided with, for example, a byte clock frequency. The microcontroller may then vary the parameters within the FEC 1801 and alter the byte clock rate 1811 to accommodate an estimated desired input data rate. The microcontroller can be provided with algorithms which examine the output rate from the input processing module 1935 and, based on the data rate estimate, set the FEC clock 1813 to an estimated frequency. The microcontroller can then further examine the output rate of the forward error correcting module 1903, make an estimate of the bit clock frequency that is needed, and set the bit clock to that frequency. In other words, the microcontroller controls the parameters of the FEC 1801 while the FIFOs within the modules 1935, 1903 and 1937 provide the needed buffering to maintain a steady data flow through the FEC. The microcontroller can also control the clocks which process the data in the modules 1935, 1903 and 1937 by using a table in memory, which relates the different parameters to the clock rate. Microcontroller 1939 can also be provided with an algorithm that will predict the clock rate based on module parameters, or the microcontroller can be provided with an algorithm or table relating the initial byte clock rate to the parameters and then examine the data flow through the module and adjust the other clocks in line as needed. Examples of values, as may be inserted into a ROM table, are given below.

The first three examples are for a input symbol rate of 21.2 megasymbols per second: (1) at a coding rate of ⅔, the byte clock is running at 5.13 megahertz, the FEC clock is running at 42.38 megahertz, and the bit clock is running at 63.57 megahertz; (2) at a ⅚ coding rate, the byte clock is running at 6.39 megahertz, the FEC clock is running at 52.98 megahertz, and the bit clock is running at 63.57 megahertz; (3) at a coding rate of ⅞, the byte clock is running at 6.81 megahertz, the FEC clock is running at 56.51 megahertz, and the bit clock is running at 63.57 megahertz.

The fourth through sixth examples describe clock rates versus coding rate for an input stream of 25 megasymbols per second: (4) at a code rate of ⅔, the byte clock is running at 6.05 megahertz, the FEC clock is running at 50 megahertz, and the bit clock is running at 75 megahertz; (5) at a coding rate of ⅚, the byte clock is running at a frequency of 7.54 megahertz, the FEC clock is running at a frequency of 62.50 megahertz, and the bit clock is running at a frequency of 75 megahertz; (6) at a coding rate of ⅞, the byte clock is running at 8.03 megahertz, the FEC clock is running at 66.67 megahertz, and the bit block is running at 75 megahertz.

The previous exemplary values illustrate that by knowing the input symbol rate and the coding rate, tables can be developed for nominal byte clock, forward error correcting clock, and bit clock rates. Such computations, as illustrated in the six examples just described, can be used to rapidly switch coding rates and clock frequencies on a frame-by-frame basis. In addition, because of the asynchronous nature of the modules within the FEC 1801, any temporary change in coding rate can be buffered by the FIFOs which connect the internal processing functions. The overall scheme employed to keep the modules functioning without queue overflow or underflow is that the upstream clocks are responsive to downstream queue sizes. Which upstream clocks are responsive to which downstream queues are design parameters that can vary from implementation to implementation. In the described exemplary embodiment, FIFO queues 1921 and 1925 are chosen to control the byte clock NCO 1811. Other combinations are possible such that the upstream clock rate is controlled by a downstream FIFO size. For example, if the training sequence and marker insertion module 1937 were eliminated from the FEC 1801, as might be the case in particular embodiments, the size of FIFO 1921 could then alone be used to control the byte clock NCO 1811.

Figure 16:
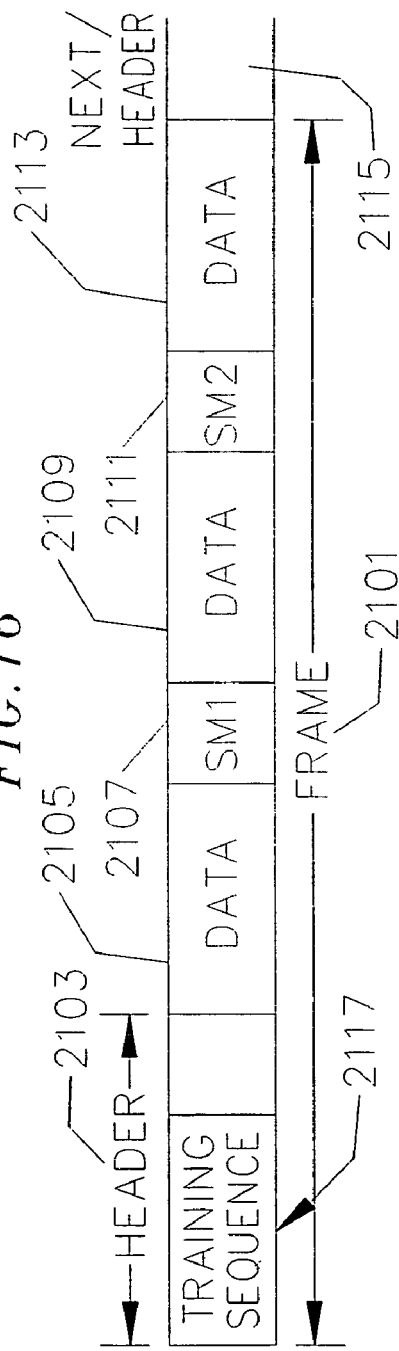
FIG. 16 is a graphical illustration of a generalized data frame, according to an embodiment of the invention.

FIG. 16 is a graphical illustration of a generalized data frame produced by the TSMI 1937, according to the present exemplary embodiment of the invention. The data frame 2101 is, in general, composed of two different sections. The first section in the header section as exemplified by 2103. The second section is the data section as exemplified by 2105, 2109 and 2113. The header is, in general, data which identifies the beginning of a frame of data. The header may comprise various data sequences. For example, one of the data sequences within the header, according to an embodiment of the present invention, is a training sequence 2117. The training sequence 2117 is a known pattern of data which the receiver system may use to lock to the frame. The training sequence can be varied in length or modulation according to parameters of the satellite system. In the present exemplary embodiment, a training sequence size of 64 symbols is used. The remainder of the header 2103 may be used for a variety of purposes, for example, but not limited to, identifying the data within the frame, identifying the modulation scheme of the data in the frame, identifying the modulation of future frames, or identifying positions of items within the data stream, such as submarkers 2107 and 2111.

Submarkers 2107 may be inserted into the data within the frame 2101 in order to provide a method for the receiver system to synchronize or track an incoming signal. In one exemplary embodiment, the submarker size is 16 symbols, and the spacing between submarkers is 10,240 symbols.

In one exemplary embodiment, the data 2105 comprises sequential blocks of turbo coded data. Submarkers may be interspersed between blocks of data (See FIG. 17). Such submarkers may be particularly useful when used with codes, such as turbo codes, which are designed to be received at low signal levels. At low signal levels receiver systems many need mechanisms to assist in signal acquisition and training.

The submarkers may be known sequences such as, for example, copies of the training sequence. Such submarkers can be used to track the incoming signal, by performing correlations on the submarker or may even be used to acquire the signal in a case, for example, when the incoming signal is disrupted by a noise burst.

Figure 17:
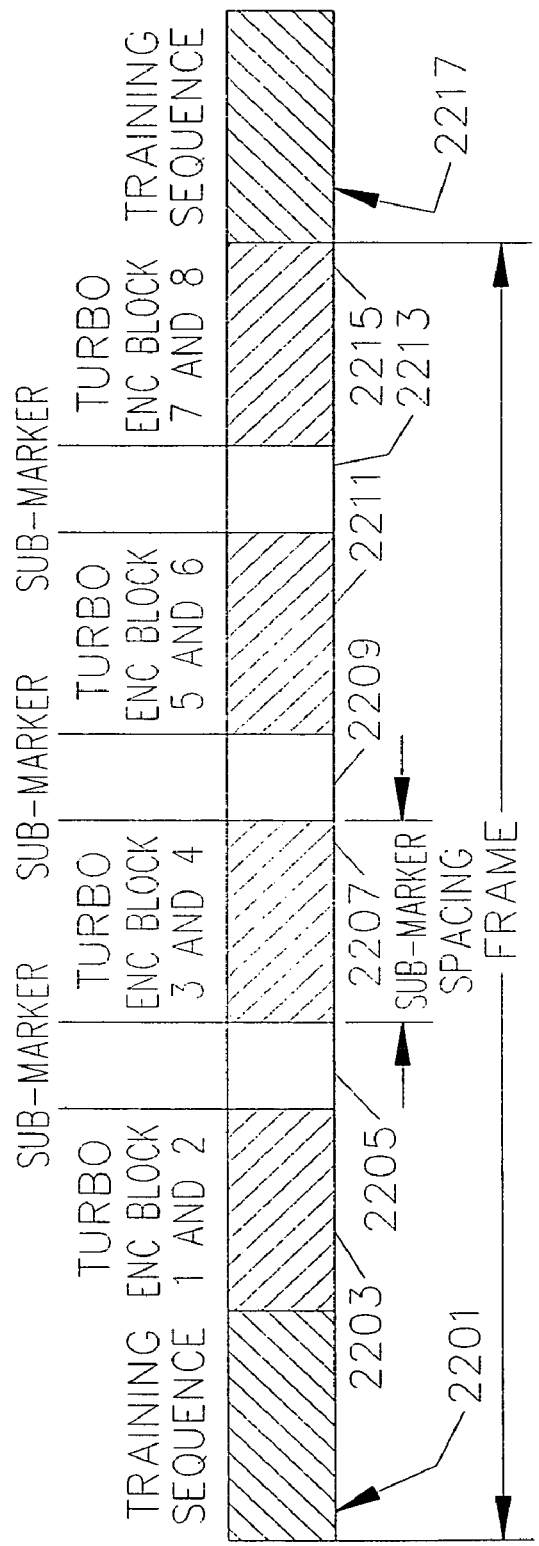
FIG. 17 is a graphical illustration of a frame of data having three submarkers disposed therein.
Figure 18:
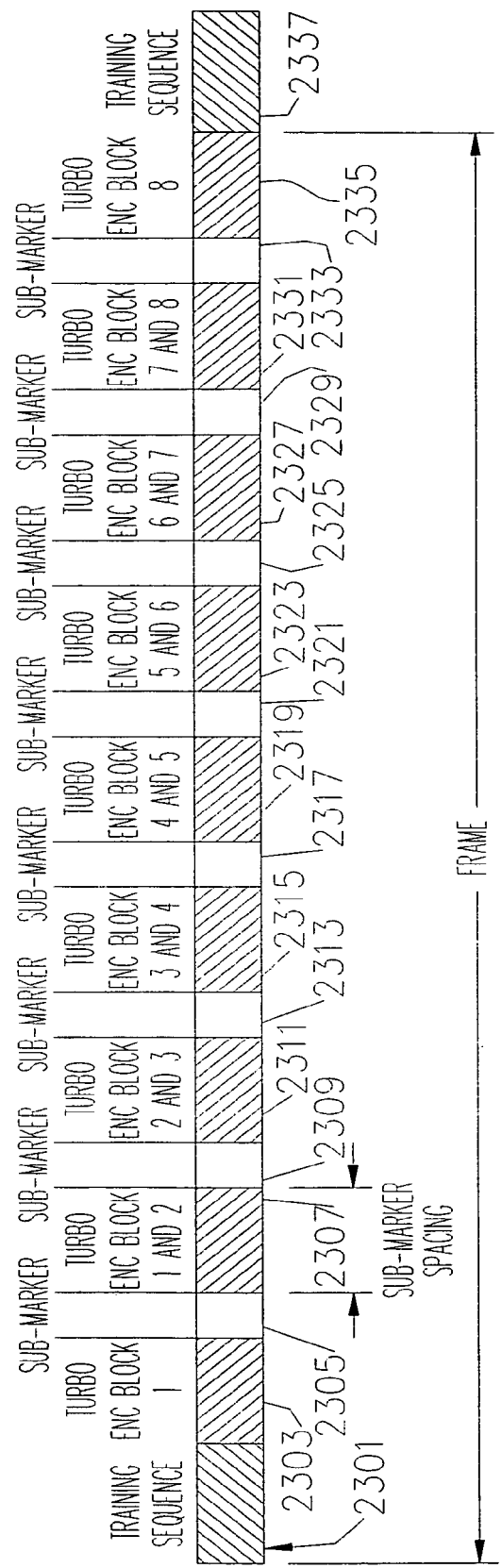
FIG. 18 is a graphical illustration of an exemplary arrangement of data blocks and submarkers within a frame.

The spacing and arrangement of submarkers is further illustrated by examples illustrated in FIGS. 17 and 18.

FIG. 17 is a graphical illustration of a frame of data having three submarkers. FIG. 17 comprises a training sequence 2201 followed by turbo encoded blocks 1 and 2 (2203). A submarker 2205 follows turbo encoded blocks 1 and 2. Following the submarker 2205 turbo encoded blocks 3 and 4 are followed by submarker 2209. Submarker 2209 is followed by turbo encoded blocks 5 and 6, which are then followed by submarker 2203 which is followed by the final turbo encoded blocks 7 and 8. Turbo encoded blocks 7 and 8 (2215) comprise the final elements within the frame. A new frame begins immediately thereafter with training sequence 2217. In the example in FIG. 17, the frame comprises 41,072 symbols. The training sequence is 64 symbols and the submarker size is 16 symbols. The spacing between submarkers is 10,240 symbols.

FIG. 18 is a graphical illustration of an exemplary arrangement of data blocks and submarkers within a frame. In FIG. 18 submarkers are interspersed within the data blocks. The frame begins with a training sequence (2301). One-half of turbo encoded block 1 is then positioned after the training sequence. The half of turbo encoded block 1 2303 is followed by submarker 2305. Submarker 2305 is then followed by the second half of turbo encoded block 1 and the first half of turbo encoded block 2 (2307). Submarker 2309 follows next, followed by the second half of turbo encoded block 2 and the first half of turbo encoded block 3 (2311). This sequence continues until the final half of turbo encoded block 8 2335 is in place. The final half of turbo encoded block 2335 marks the end of the frame. The end of the frame is followed by a training sequence 2337 signaling the start of the next frame. The example illustrated in FIG. 18 includes a frame of 41,152 symbols. The training sequence size is 64 symbols and the submarker size is 16 symbols. The spacing between submarkers is 5,000 symbols versus 10,400 in the example illustrated in FIG. 17. The spacing and submarker size may vary according to the characteristics of the receiver that is receiving the signal. For example the submarkers may comprise copies of the training sequence.

Because of the flexibility of the system, a frame as illustrated in FIG. 17 may be followed immediately by a frame as illustrated in FIG. 18. The frame in FIG. 18 may be used, for example, when delivering data to a receiver system which is receiving a signal of low signal strength.

The following examples are not exhaustive. For example submarkers may be placed between every block of turbo coded data, or they may be placed between every block of turbo coded data and additionally within the block of turbo coded data.

The Set Top Box

A generalized block diagram of a set top box 115, according to an exemplary embodiment of the present invention, is illustrated in FIG. 19. The set top box 115 receives the signal from the ODU 119. The signal received from the ODU 119 may include a frequency band of signals, for example 950 to 2150 megahertz. The signal from the ODU 119 is coupled into the exemplary set top box 115.

Within the set top box, the tuner 2901 selects the desired band of frequencies from the signal provided by the ODU 119. The desired band of signals is then down converted in the tuner from a high frequency signal into a frequency which may be accepted by a signal demodulator 2903.

The demodulator 2903 accepts the down converted signal from the tuner 2901, and converts the signal into a data stream. The data stream from the demodulator may then be provided to a turbo decoder 2905.

Within the turbo decoder 2905, the process of recreating the data sent by the transmit system is begun. As described earlier, the data stream from the FEC of the transmit system has been turbo code encoded to help correct errors which occur in the signal. Errors in the signal occur due to factors such as noise within the channel, atmospheric conditions, electrical interference, and a variety of other interference sources. Turbo codes are used, in part, because they provide a robust way of encoding a signal. Turbo codes may enable a signal to be reconstructed at lower signal levels, i.e., lower signal to noise ratios, than may be possible with other codes alone.

The turbo decoder 2905 is coupled to and cooperates with an interleaver 2907. An interleaver is a device that, in the transmit system, changes the order of the data from the order received into another order. A receive interleaver may change the data so that it is no longer in sequential order, but in a random but known sequence. A receive interleaver, e.g. 2907, is alternatively known as a de-interleaver. The receive interleaver converts the random data sequence back into normal sequential order. Interleavers may also cooperate with encoders in the transmit system in order to encode the data signal, and decoders in the receiver system to decode the data signal. A burst error, which affects an adjacent sequence of bits, can be minimized if the signal has been interleaved. In an interleaved signal, the bits containing errors may be decoded with other bits, which were transmitted at a time when the interfering signal was not present. The interleaver 2907 further produces a data stream which is then provided to a Reed-Solomon decoder 2909.

The Reed-Solomon decoder 2909 further decodes the data stream. By successfully coding a signal with a turbo coder in conjunction with a Reed-Solomon coder the signal can be made more robust, i.e., can be decoded at lower signal to noise levels, than if either type of coding had been used separately. The block including the demodulator 2903, the turbo decoder 2905, the interleaver 2907 and the Reed-Solomon decoder 2909 are generally referred to as the receiver 2919. The output of the Reed-Solomon decoder is provided to a video unit 2911. The video module accepts the data from the Reed-Soloman Decoder 2909 and converts it into a form which may be used by a user device such as the television.

The Demodulator

FIG. 20 is a block diagram of an exemplary demodulator in accordance with an embodiment of the present invention. In-phase and quadrature signals are received by analog to digital (A/D) converters 3103 and 3105. The A/D converters 3103 and 3105 are controlled by a free-running sample clock (not shown). The frequency of the sample clock driving A/D converters 3105 and 3103 is a non-integer multiple of the symbol rate.

An automatic gain control (AGC) 3107 examines the signal size at the output of the A/D converters 3103 and 3105. Maximum resolution can be obtained with a input signal whose maximum size corresponds to the range of the A/D converters. The AGC controls the gain of amplifiers that amplify input signals prior to providing them to the A/D converters. From the A/D converters the data is provided to the multiplier block 3113. In the multiplier block a digital frequency shift is introduced to cancel any frequency offset which exists between the clocks of the transmitter system and receiver system.

The frequency loop 3115 serves to change the multiplication factor and thereby cancel the frequency offset. The data is then coupled into decimation filters 3119 and 3121. The decimation filters reduce the data rate, thereby filtering the data. From the decimation filters the signal values are coupled into symbol sample (SS) blocks 3127 and 3129. The SS blocks 3127 and 3129 extract symbol values from the signal values presented to it by the decimation filter. The symbol extraction is synchronized using a symbol timing loop 3131. The symbols retrieved by the SS blocks are next provided to Nyquist filters 3133 and 3135, which provide the symbols with Nyquist filtering. From the Nyquist filter the symbols are coupled to the demodulator output 3109 and 3111.

Receiver Synchronization with Frequency Offset

As explained earlier, in a receiver system, such as illustrated in FIG. 20, two basic problems need to be dealt with. The first problem is that the center frequency of the signal, which the receiver system is attempting to synchronize with, may be offset by a considerable amount (referred to as the delta frequency). The delta frequency arises because the receiver clock is not the same frequency as the transmitter clock. The receiver system must adjust its clock to match the transmission clock. The frequency of the transmission clock, also called the carrier frequency, may also vary over time. A second problem is that transients, such as intermittent noise, changing atmospheric conditions, and interference from other signal sources, may cause relatively short duration deviations or interruptions of the signals input to the system. These deviations may cause transient phase deviations, which need to be accounted for by the system. The process of matching the carrier frequency to the receiver frequency is often referred to as acquisition, and the process of maintaining phase lock to a signal, despite transient noise and interference conditions, is often called tracking.

The frequency offset of the incoming signal is adjusted within the multiplier 3113, illustratively a digital complex multiplier. The basic operation of the multiplier 3113 is to multiply the incoming signal and thereby create a frequency translation of the incoming frequency. The multiplier 3113 will create frequency images equal to the input frequency plus the multiplying frequency and also equal to input frequency minus the multiplying frequency. The multiplying frequency is provided from within a frequency loop block 3115.

The frequency loop 3115 includes a phase detector 3149, which detects the phase difference of the outputs of the Nyquist filters 3133 and 3135 and the input signal as provided by multiplier 3113.

The symbol timing loop 3131 adjusts the timing of symbol sampling, that is it selects the value which will be decoded as a symbol.

When the system is initially turned on, both the frequency loop 3115 and the symbol timing loop 3131 are disabled by the correlator 3101. The correlator then examines the incoming symbols and estimates, the frequency offset between the receiver clock and the transmitter clock, as previously described in the section on the differential correlator. Once the correlator 3101 has estimated the difference between the carrier frequency and the receiver clock frequency, the value of the offset between the transmitter frequency and the receiver frequency, that value can be inserted, as a starting value, into the frequency loop 3115. Once the offset frequency has been loaded into the frequency loop by the correlator, the correlator may then enable the loop. The frequency loop can then quickly lock in and track the carrier frequency. The header processor also estimates the phase offset within the symbol timing loop 3131. Once the correlator-processor 3101 has an estimate of the phase offset in the symbol timing loop, it can be inserted into the symbol timing loop. When the header processor couples the initial value into the symbol timing loop 3131, the header processor may enable the symbol timing loop 3131. By providing starting value for the frequency loop 3115, the acquisition time of the frequency loop 3115 is decreased over a conventional type methodology, in which the phase detector alone causes the synchronization of the loop starting at an arbitrary value. Similarly, by providing an initial value for the symbol timing loop 3131 and then enabling the loop, the tracking function within the symbol timing loop can lock to the symbol stream much faster than if it had started from an arbitrary value. Additionally, because the frequency of the loop 3115 does not traverse a range of values, the false lock problem, in which the system may lock to an incorrect frequency, is minimized.

Receiver Synchronization Using Interspersed Data

Additionally, in order to aid acquisition and tracking, the correlator-processor can enable the symbol timing loop 3131 in such a manner that only the training sequence and submarkers are used for synchronizing the symbol timing loop 3131. The same training sequence and submarkers may also be gated into the frequency timing loop 3115 for the purpose of synchronizing the frequency timing loop 3115.

Although a preferred embodiment of the present invention has been described, it should not be construed to limit the scope of the appended claims. Those skilled in the art will understand that various modifications may be made to the described embodiment. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A method of creating a data sequence, comprising:
placing a training sequence at a beginning of a data frame;
placing a plurality of the data blocks within the data frame following the training sequence; and
interspersing a plurality of submarkers within the plurality of data blocks.

2. The method of claim 1, wherein:
the interspersing of the submarkers comprises interspersing one of the submarkers between two data blocks.

3. The method of claim 1, wherein:
the interspersing of the submarkers comprises interspersing each of the submarkers between different pairs of the data blocks.

4. The method of claim 1, wherein:
the interspersing of the submarkers comprises interspersing one of the submarkers within one of the data blocks.

5. The method of claim 1, wherein:
the interspersing of the submarkers comprises interspersing each of the submarkers within a different one of the data blocks.

6. The method of claim 1, wherein:
the interspersing of the submarkers comprises copying either at least a portion of the training sequence at the beginning of the data frame or copying the training sequence at the beginning of the data frame; and further comprising:
interspersing either at least a portion of the copied training sequence or the copied training sequence between one of the data blocks.

7. The method of claim 1, wherein:
the interspersing of the submarkers comprises copying either at least a portion of the training sequence at the beginning of the data frame or copying the training sequence at the beginning of the data frame; and further comprising:
interspersing either at least a portion of the copied training sequence or the copied training sequence between each of the data blocks.

8. A training sequence and submarker insertion apparatus, the apparatus comprising:
an input that is operable to receive a plurality of data blocks; and
an inserter that is operable to insert a training sequence before the data blocks and insert a plurality of submarkers within the data blocks thereby creating a data frame.

9. The apparatus of claim 8, wherein:
the inserter is operable to insert one of the submarkers between two data blocks.

10. The apparatus of claim 8, wherein:
the inserter is operable to insert each of the submarkers between different pairs of the data blocks.

11. The apparatus of claim 8, wherein:
the inserter is operable to insert one of the submarkers within one of the data blocks.

12. The apparatus of claim 8, wherein:
the inserter is operable to insert each of the submarkers within a different one of the data blocks.

13. The apparatus of claim 8, wherein:
the inserter is operable to insert either at least a portion of the training sequence or the training sequence between one of the data blocks in addition to inserting the training sequence at the beginning of the data frame.

14. The apparatus of claim 8, wherein:
the inserter is operable to insert either at least a portion of the training sequence or the training sequence between each of the data blocks in addition to inserting the training sequence at the beginning of the data frame.

15. The apparatus of claim 8, wherein:
the inserter is programmable as to the insertion of the submarkers within the data blocks.

16. The apparatus of claim 15, wherein:
the inserter is programmable either to insert the submarkers between the data blocks or to insert the submarkers within the data blocks.

17. A method for creating a data sequence, comprising:
encoding data thereby generating a plurality of encoded data blocks;
creating a data frame comprising a first portion and a second portion, the first portion preceding the second portion in time;
placing a training sequence in the first portion of the data frame;
placing the encoded data blocks in the second portion of the data frame; and
interspersing a plurality of submarkers within the encoded data blocks.

18. The method of claim 17, wherein:
the interspersing of the submarkers comprises either interspersing one of the submarkers between two encoded data blocks or interspersing each of the submarkers between different pairs of the encoded data blocks.

19. The method of claim 17, wherein:
the interspersing of the submarkers comprises either interspersing one of the submarkers within one of the encoded data blocks or interspersing each of the submarkers within a different one of the encoded data blocks.

20. The method of claim 17, wherein:
the interspersing of the submarkers comprises copying either at least a portion of the training sequence in the first portion of the data frame or the training sequence in the first portion of the data frame; and further comprising:
interspersing either at least a portion of the copied training sequence or the copied training sequence between each of the encoded data blocks.

* * * * *

UNITED STATES PATENT AND TRADEMARK OFFICE
CERTIFICATE OF CORRECTION

| | | |
|---|---|---|
| PATENT NO. | : 7,420,481 B2 | Page 1 of 1 |
| APPLICATION NO. | : 11/116851 | |
| DATED | : September 2, 2008 | |
| INVENTOR(S) | : Steven T. Jaffe et al. | |

It is certified that error appears in the above-identified patent and that said Letters Patent is hereby corrected as shown below:

Title Page, (*) Notice, please replace "This patent is subject to a terminal disclaimer." with --This patent is subject to a terminal disclaimer, and specifically with respect to prior U.S. patents 6,897,791; 6,693,566; 6,891,485; 6,828,926 and 6,985,093.--

Signed and Sealed this
Twenty-sixth Day of July, 2011

David J. Kappos
*Director of the United States Patent and Trademark Office*